(12) United States Patent
Buynoski et al.

(10) Patent No.: US 6,518,107 B2
(45) Date of Patent: Feb. 11, 2003

(54) NON-ARSENIC N-TYPE DOPANT IMPLANTATION FOR IMPROVED SOURCE/DRAIN INTERFACES WITH NICKEL SILICIDES

(75) Inventors: Matthew S. Buynoski, Palo Also, CA (US); Qi Xiang, San Jose, CA (US); Paul R. Besser, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/813,308

(22) Filed: Mar. 21, 2001

(65) Prior Publication Data

US 2002/0146904 A1 Oct. 10, 2002

Related U.S. Application Data (60) Provisional application No. 60/268,920, filed on Feb. 16, 2001.

(51) Int. Cl.$^7$ .......................... H01L 21/00; H01L 21/84
(52) U.S. Cl. ...................................................... 438/161
(58) Field of Search ................................ 438/161, 305, 438/529; 257/408

(56) References Cited

U.S. PATENT DOCUMENTS

| | | | | |
|---|---|---|---|---|
| 5,141,882 A | * | 8/1992 | Komori et al. | 437/34 |
| 5,389,809 A | * | 2/1995 | Haken et al. | 257/344 |
| 5,413,944 A | * | 5/1995 | Lee | 437/34 |
| 5,478,759 A | * | 12/1995 | Mametani et al. | 437/30 |
| 5,728,625 A | * | 3/1998 | Tung | 438/586 |
| 5,856,695 A | * | 1/1999 | Ito et al. | 257/370 |
| 6,017,787 A | * | 1/2000 | Chittipeddi et al. | 438/228 |
| 6,051,494 A | * | 4/2000 | Iwamatsu et al. | 438/683 |
| 6,150,243 A | * | 11/2000 | Wieczorek et al. | 438/558 |
| 6,187,620 B1 | * | 2/2001 | Fulford, Jr. et al. | 438/230 |
| 6,207,563 B1 | * | 3/2001 | Wieczorek et al. | 438/664 |
| 6,255,703 B1 | * | 7/2001 | Hause et al. | 257/384 |
| 6,258,680 B1 | * | 7/2001 | Fulford, Jr. et al. | 438/305 |
| 6,268,255 B1 | * | 7/2001 | Besser et al. | 438/303 |
| 6,274,511 B1 | * | 8/2001 | Wieczorek et al. | 438/766 |
| 6,297,114 B1 | * | 10/2001 | Iwata et al. | 438/305 |
| 6,319,805 B1 | * | 11/2001 | Iwamatsu et al. | 438/592 |
| 6,362,095 B1 | * | 3/2002 | Woo et al. | 438/649 |

OTHER PUBLICATIONS

S. Wolf, Silicon Processing for the VLSI Era, Lattice Press, vol. II, pp.144–152; 682; 286; 291; 300; 325–7.*

* cited by examiner

Primary Examiner—Vu A. Le
Assistant Examiner—Michael K. Luhrs (57) ABSTRACT

Disadvantageous roughness of interfaces between electrically conductive NiSi layers and n-doped Si interfaces arising during conventional salicide processing for forming shallow-depth source and drain junction regions of NMOS transistors and/or CMOS devices is avoided, or at least substantially reduced, by substituting implanted non-As-containing n-type dopant ions, such as P and/or Sb ions, for the conventionally utilized implanted As n-type dopant ions. If desired, shallow-depth source and drain extensions may be formed by implantation of As-containing n-type dopant ions above the region comprising the non-As-containing dopant ions without causing roughness of the NiSi/n-doped Si interface.

15 Claims, 4 Drawing Sheets

NON-ARSENIC N-TYPE DOPANT IMPLANTATION FOR IMPROVED SOURCE/DRAIN INTERFACES WITH NICKEL SILICIDES

CROSS-REFERENCE TO PROVISIONAL APPLICATION

This application contains priority from U.S. Provisional patent application No. 60/268,920, filed Feb. 16, 2001, the entire disclosure of which is incorporated herein by reference.

FIELD OF THE INVENTION

The present invention relates to a method of manufacturing semiconductor devices, e.g., high-density integrated circuit ("IC") semiconductor devices exhibiting reliable, high quality, adherent, low resistance, well-aligned contacts to source, drain, and gate regions of active devices, such as MOS and CMOS transistors formed in or on a semiconductor substrate, by utilizing self-aligned, metal silicide ("salicide") processing methodology. The present invention enjoys particular utility in the manufacture of high-density integration semiconductor devices, including multi-level devices, having design rules of 0.18 μm and below, e.g., 0.15 μm and below.

BACKGROUND OF THE INVENTION

The escalating requirements for high density and performance associated with ultra-large scale integration (ULSI) devices necessitate design rules of 0.18 μm and below, such as 0.15 μm and below, with increased transistor and circuit speeds, high reliability, and increased manufacturing throughput. The reduction in feature sizes, e.g., of source, drain, and gate regions of transistors formed in or on a common semiconductor substrate, challenges the limitations of conventional contact and interconnection technology, including conventional photo-lithographic, etching, and deposition techniques.

As a result of the ever-increasing demand for large-scale and ultra small-dimensioned IC devices, self-aligned techniques have become the preferred technology for forming such devices in view of their simplicity and capability of high-density integration. As device dimensions decrease in the deep sub-micron range, both vertically and laterally, many problems arise, especially those caused by an increase in the sheet resistance of the contact areas to the source and drain regions and junction leakage as junction layer thickness decreases. To overcome this problem, the use of self-aligned, highly electrically conductive metal silicides, i.e., "salicides" (derived from Self-ALIgned-siliCIDE), has become commonplace in the manufacture of IC semiconductor devices comprising, e.g., MOS type transistors. Another technique employed in conjunction with metal silicide technology is the use of lightly-doped, shallow-depth source and drain extensions formed just at the edge of the gate region, while more heavily-doped source and drain regions, to which ohmic contact is to be provided, are laterally displaced away from the gate by provision of sidewall spacers on opposing sides of the gate electrode.

Salicide processing involves deposition of a metal that forms an intermetallic compound with silicon (Si), but does not react with silicon oxides, nitrides, or oxynitrides under normal processing conditions. Metals commonly employed in salicide processing include platinum (Pt), titanium (Ti), nickel (Ni), and cobalt (Co), each of which forms very low resistivity phases with Si, e.g., $PtSi_2$, $TiSi_2$, NiSi, and $CoSi_2$. In practice, the metal is deposited in a uniform thickness over all exposed surface features of a Si wafer, preferably by means of physical vapor deposition ("PVD") process, e.g., sputtering from an ultra-pure target utilizing an ultra-high vacuum, multi-chamber DC magnetron sputtering system. In MOS transistor formation, deposition is generally performed after both gate etch and after source/drain formation. After deposition, the metal layer blankets the top surface of the gate electrode, typically formed of a heavily-doped polysilicon, the silicon oxide, nitride, or oxynitride sidewall spacers on the opposing side surfaces of the gate electrode, the silicon oxide isolation regions formed in the Si substrate between adjacent active device regions, and the exposed surfaces of the substrate where the source and drain regions are to be formed or will subsequently be formed. As a result of thermal processing, e.g., a rapid thermal annealing ("RTA"), the metal layer reacts with underlying Si to form electrically conductive metal silicide layer portions on the top surface of the polysilicon gate electrode and on the exposed surfaces of the substrate where source and drain regions are or will be formed. Unreacted portions of the metal layer, e.g., on the silicon oxide, nitride, or oxynitride sidewall spacers and the silicon oxide isolation regions, are then removed, as by a wet chemical etching process selective to the metal silicide portions. In some instances, e.g., with Co, a first RTA step may be performed at a relatively lower temperature in order to form first-phase CoSi, which is then subjected to a second RTA step performed at a relatively high temperature to convert the first-phase CoSi to second-phase, lower resistivity $CoSi_2$.

A number of different techniques and fabrication processes have been either proposed or utilized for forming MOS transistors and/or CMOS devices according to salicide methodology. Referring to FIGS. 1(A)–1(I), shown therein, for illustrative purposes only, is an example of a typical salicide-based process according to conventional processing technology. In a preliminary step, shown in FIG. 1(A), a silicon (Si) or Si-based substrate 102, typically a monocrystalline Si wafer of one conductivity type (p or n) or comprising a well region of one conductivity type formed therein, is processed, as by conventional techniques such as formation of field oxide regions, local oxidation of silicon ("LOCOS"), shallow trench isolation ("STI"), etc., to define a plurality of electrically separated regions. In the illustrated embodiment, shallow isolation trenches 216 (only one is shown for illustrative simplicity) are formed in a surface portion of substrate 102, as by isotropic etching utilizing wet chemical etching techniques or by anisotropic etching utilizing dry etching techniques, e.g., reactive plasma etching. Trenches 216 are then filled with an oxide 218 layer, such that an edge 220 of the oxide 218 contacts the substrate 102 at locations where doped regions will subsequently be formed within the substrate 102. (Trench 216 and oxide layer 218 are not shown in the following drawing figures for illustrative simplicity).

Figure 1A:
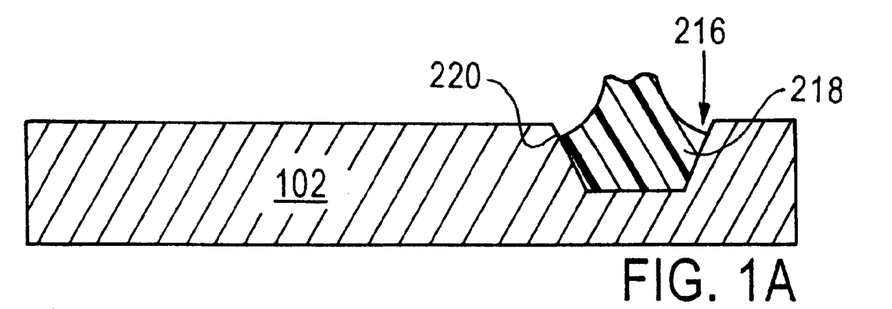
FIGS. 1(A)–1(I) are schematic, simplified, cross-sectional views illustrating stages in the formation of an NMOS transistor according to conventional salicide methodology.
Figure 1B:
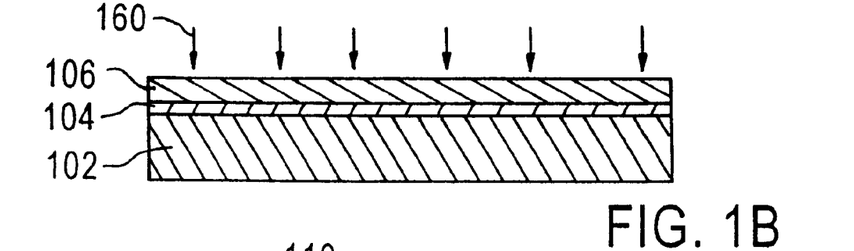

Referring now to FIG. 1(B), a thin gate oxide (insulator) layer 104, typically a silicon oxide layer about 15–50 Å thick, is formed on the upper surface of substrate 102, e.g., by thermal oxidation at temperatures of from about 700 to about 1,000° C. in an oxidizing atmosphere. After formation of the gate oxide layer 104, a blanket layer of un-doped polysilicon 106 is deposited on the gate oxide layer 104, for example, by low pressure chemical vapor deposition ("LPCVD"). If desired, polysilicon layer 106 can be treated to retard diffusion of boron (B) atoms therethrough, as by implantation with nitrogen ($N_2$) ions, symbolically indicated in the figure by arrows 160.

Figure 1C:
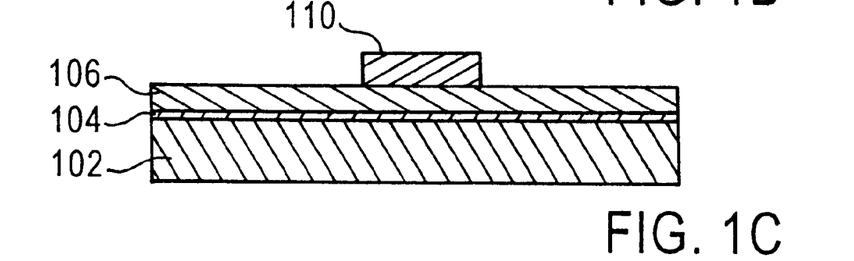
Figure 1D:
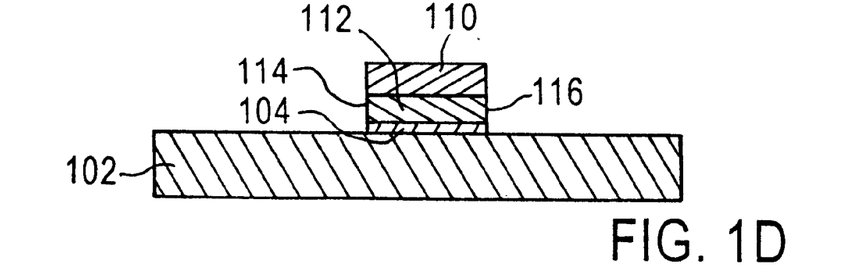

Adverting to FIG. 1(C), a continuous photoresist layer 110 is then deposited on the polysilicon layer 106, and the photoresist layer 110 is selectively irradiated utilizing photolithographic masking techniques and developed, followed by removal of the selectively irradiated portions thereof to expose portions of the polysilicon layer 106 which are to be removed to define a gate electrode. As shown in FIG. 1(D), the exposed portions of polysilicon layer 106 and the respective underlying portions of the thin gate oxide layer 104 are removed, as by anisotropic etching, to form polysilicon gate electrode 112 having vertically opposed sidewalls or edges 114, 116.

Figure 1E:
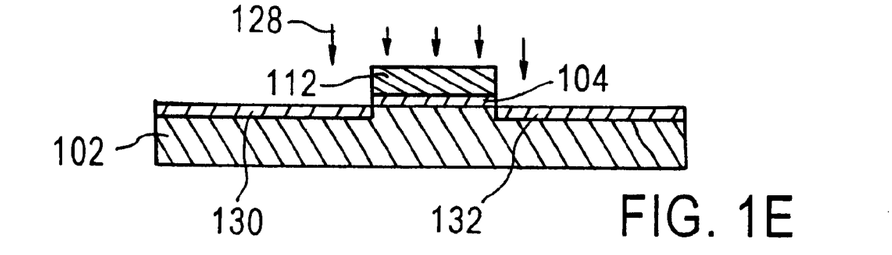

With reference to FIG. 1(E), the remaining portion of the photoresist layer 110 is then stripped from the upper surface of the polysilicon gate electrode 112 and a pair of shallow-depth, source and drain extension regions 130, 132 are formed in substrate 102 by an ion implantation ("extension implant") process, utilizing the polysilicon gate electrode 112 as an implantation mask. Source and drain extension regions 130, 132 thus are formed in a self-aligned manner and extend within the substrate 102 to immediately adjacent the edges of sidewalls 114, 116 of the gate electrode/gate oxide layer stack 112/104. The implanted ions may comprise an n-type dopant, e.g., As ions, if an NMOS is desired to be formed, or a p-type dopant, e.g., B-containing ions, if a PMOS is to be formed. By way of illustration only, n-type source and drain extension regions 130, 132 having a depth of from about 100 to about 200 Å and a doping of from about $1 \times 10^{20}$ to about $1 \times 10^{21}$ da/cm$^3$ may be formed in crystalline Si by implanting As ions at a dosage of from about $1 \times 10^{15}$ to about $2 \times 10^{15}$ da/cm$^2$ and energies of from about 2 to about 5 KeV.

Figure 1F:
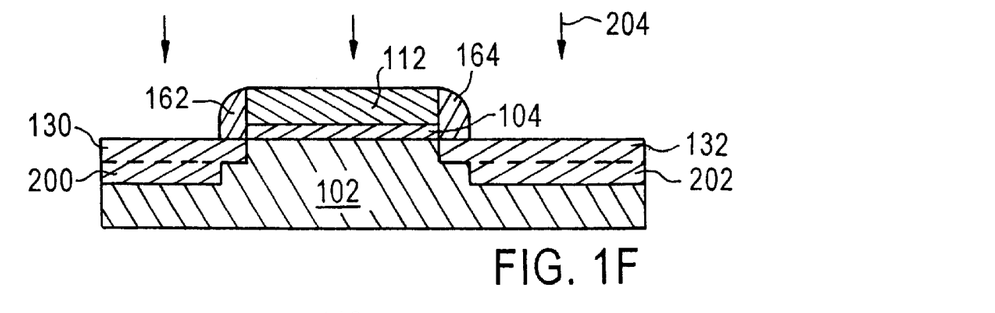

Referring now to FIG. 1(F), tapered width sidewall spacers 162, 164 comprised of an insulative material, typically a silicon oxide, nitride, or oxynitride, are then formed on the surfaces of sidewalls 114, 116 of the gate electrode/gate oxide layer stack 112/104. Typically, the tapered width sidewall spacers 162, 164 are formed by a process comprising forming, as by a suitable conventional deposition method, a blanket layer of the insulative material covering all exposed surface portions of the substrate 102 as well as all exposed surfaces of the various features formed therein or thereon, including, inter alia, the opposing sidewall surfaces 114, 116 and top surface of the polysilicon gate electrode 112. The thickness of the blanket insulative layer is selected so as to provide tapered sidewall spacers 162, 164 having a desired width profile. The blanket insulative layer is then subjected to an anisotropic etching process, e.g., plasma etching in a fluorine-containing plasma, for selectively removing the laterally extending portions thereof and forming the tapered width sidewall spacers 162, 164. Following the formation of the tapered sidewall spacers 162, 164, a pair of deeper source and drain regions 200, 202 are formed, as by a "main implant" ion implantation process utilizing the tapered sidewall spacers 162, 164 as implantation masks, generally within the portions of substrate 102 where the shallow-depth source and drain extension regions 130, 132 were previously formed. As shown in the figure, the source and drain regions 200, 202 formed by the "main implant" process extend beyond the depth of source and drain extension regions 130, 132, except at the portions of the latter regions underlying the sidewall spacers 162, 164. By way of illustration only, according to conventional practice, typical As implantation conditions for forming source and drain regions 200, 202 of a crystalline Si wafer-based NMOS transistor having a peak As n-type dopant concentration of from about $1 \times 10^{20}$ to about $1 \times 10^{21}$ da/cm$^3$ at a depth of from about 200 to about 400 Å below the surface of the Si wafer include dosages of from about $3 \times 10^{15}$ to about $6 \times 10^{15}$ da/cm$^2$ and energies of from about 10 to about 40 KeV.

Figure 1G:
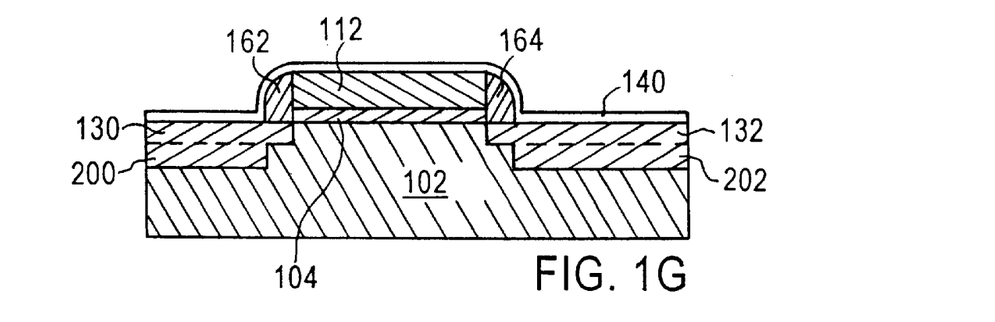

With reference to FIG. 1(G), in a following step, a blanket layer 140 of a metal, typically Pt, Co, Ni, or Ti, is formed, as by a PVD process such as DC sputtering, to cover all exposed surfaces of the thus-formed structure. The thickness of the metal layer deposited in this step depends upon several factors, including, inter alia, the particular selected metal, its Si consumption ratio, and desired thickness (hence resistance) of the resultant metal silicide.

Figure 1H:
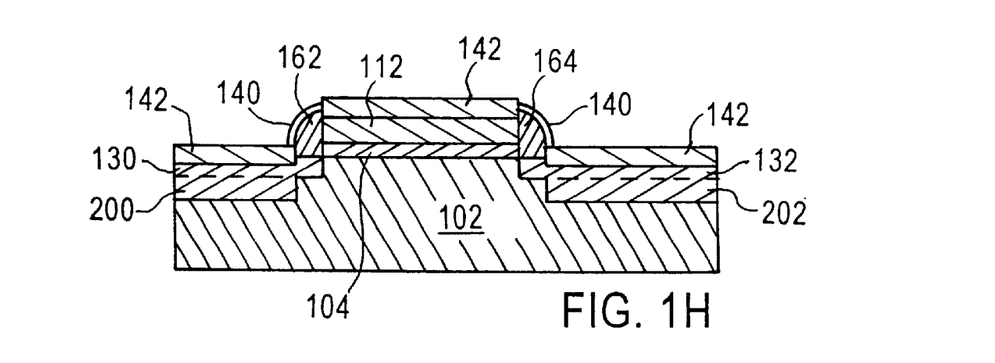
Figure 1I:
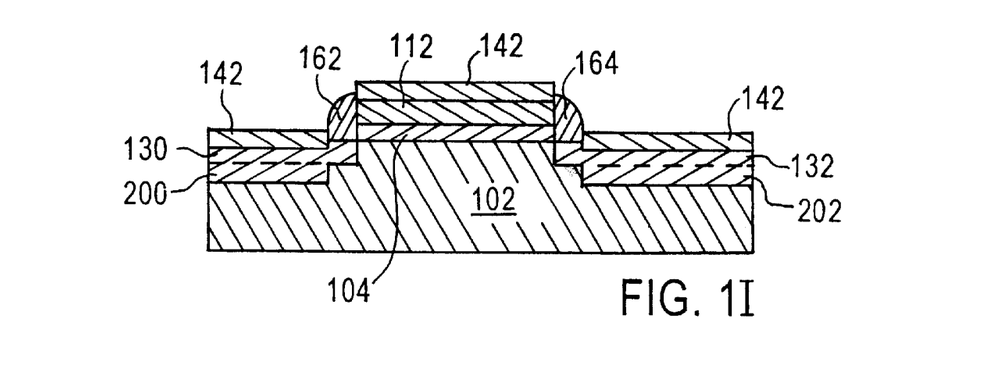

Adverting to FIG. 1(H), following metal layer 140 deposition, a thermal treatment, typically RTA, is performed at a temperature and for an interval sufficient to convert at least a portion of the thickness of metal layer 140 to the corresponding electrically conductive metal silicide 142, e.g., PtSi$_2$, CoSi$_2$, NiSi, or TiSi$_2$. Since the metal silicide 142 forms only where the metal layer 140 is in contact with underlying Si of Si substrate 102, the unreacted portions of the metal layer 140 formed over the sidewall spacers 162, 164 and oxide-filled isolation trenches 216 (not shown in the figure for simplicity) are selectively removed, as by a wet chemical etch process, to yield the structure shown in FIG. 1(I), which structure can then undergo further processing for contact formation to the source/drain regions and gate electrode.

When Ni is utilized as metal layer 140, conversion of Ni to NiSi may be accomplished by means of a one-step thermal process, typically RTA performed at temperatures of from about 350 to about 750° C., for example, in a N$_2$ atmosphere at 550° C. for about 40 sec. The formation of NiSi commences at about 250° C., when the Ni layer 140 reacts with the Si substrate 102 to form Ni$_2$Si. With increase in reaction time or temperature to above about 300° C., the Ni$_2$Si undergoes further reaction with the Si substrate 102 to form NiSi layer 142. By way of illustration only, a Ni layer 140 from about 100 to about 200 Å thick may be subjected to silicidation reaction with the Si substrate 102 (as described above) to form a NiSi layer 142 extending to a depth below the Si substrate 102 of from about 180 to about 360 Å. Removal of any unreacted portions of Ni layer 140 can be accomplished, for example, by etching with a 2:1 H$_2$SO$_4$/H$_2$O$_2$ mixture at a temperature of about 100° C. An aqueous mixture of NH$_4$OH and H$_2$O$_2$ may be utilized for stripping other unreacted metals, i.e., Co, Ti, Pt.

Figure 2:
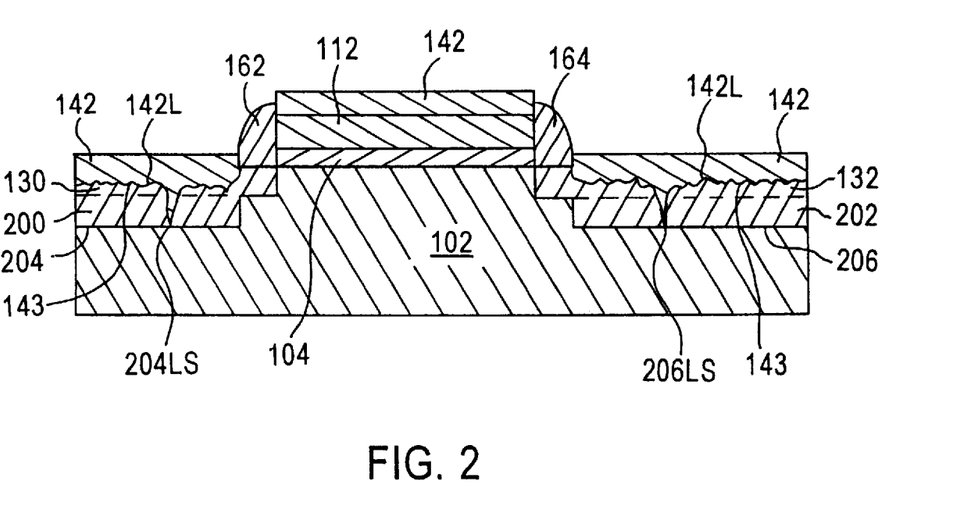
FIG. 2 is a schematic, simplified, cross-sectional view illustrating the effect of NiSi/n-Si interface roughness characteristic of the conventional NMOS salicide methodology on local penetration of the source/drain junctions.

Referring now to FIG. 2, a problem frequently encountered with salicide processing sequences, such as the one described supra, is the formation of metal silicide layers 142 wherein the lower surfaces 142L thereof are rough at the metal silicide/Si interfaces 143, which roughness can disadvantageously result in penetration of the underlying silicon substrate 102 by the metal silicide layer 142. In particular, such penetration, or "spiking" of the Si substrate 102 in the regions below the source and drain regions 200, 202 can cause local electrical punch-through of the source and drain junctions 204, 206 for example, as indicated by 204LS, 206LS, respectively, in the figure, thereby resulting injunction leakage. While the effect of local electrical punch-through or spiking is significant when a metal having a high Si consumption ratio is utilized, e.g., Co, silicide/Si interface roughness resulting in local electrical punch-through can also result from incompatibility between a particular metal and a particular dopant species utilized for forming the source and drain regions. In this regard, a notable (but not exclusive) example is the incompatibility of Ni as the metal and As atoms/ions as the n-type dopant species for Si, e.g., in the formation of Si-based NMOS transistors and CMOS devices.

Specifically, the presence of significant amounts of As in NiSi layers on source/drain regions of NMOS transistors and CMOS devices results in a substantial amount or degree of roughness at the NiSi/n-Si interface, leading to increased junction leakage due to local electrical punch-through or "spiking" of the source/drain junctions as described above. Further, since As atoms or ions tend to be rejected (i.e., expelled) from NiSi films, they can accumulate in the vicinity of the NiSi/Si interface and transit through the interface to the substrate region below the interface, thereby exacerbating the problem of local electrical punch-through, disadvantageously altering the dopant concentration vs. depth profile so as to degrade transistor properties. Such incompatibility with NiSi is peculiar to As (i.e., it is not observed with other n-type dopant species) and is particularly troublesome in that (1) As is otherwise advantageous vis-à-vis the other common n-type dopant species (i.e., phosphorus (P) and antimony (Sb)) utilized in forming ion implanted, shallow junction source and drain regions in high-speed, Si-based NMOS transistors and CMOS devices, in view of its low diffusivity (with respect to P) and high solid solubility (with respect to Sb); and (2) NiSi is a preferred electrically conductive, metal silicide material vis-à-vis other metal silicides ($CoSi_2$, $TiSi_2$, $PtSi_2$, etc.) in view of its rapid formation at relatively low temperatures (350–600° C.) in a one-step RTA process, lack of linewidth dependence, low resistivity, low Si consumption ratio, and increased process flexibility.

Accordingly, there exists a clear need for improved methodology for simple, reliable, and rapid formation of NiSi layers for use in the manufacture of Si-based semiconductor IC devices, e.g., in the formation of electrically conductive contact layers to n-type dopant-containing source and drain regions in NMOS transistors and/or CMOS devices, which methodology avoids the drawbacks associated with the conventional salicide techniques and methodologies and provides, inter alia, high-quality NMOS transistors and/or CMOS devices exhibiting reduced junction leakage and improved transistor characteristics and properties.

The present invention, wherein As-containing ions, the conventional and heretofore preferred n-type dopant species utilized for forming n-type doped source and drain regions in submicron-dimensioned NMOS transistors and CMOS devices, are removed from at least portions of the source and drain regions by substituting at least one non-As-containing n-type dopant ion species for the As ions, eliminates, or at least substantially reduces, the disadvantageous interaction (s) between the NiSi layer and the n-type dopant species leading to roughness of the NiSi/n-Si interface and resultant local electrical punch-through of the source/drain junctions. The inventive methodology thus effectively addresses and solves the need for improved salicide-type methodology for the manufacture of high-quality MOS transistors and/or CMOS devices with reduced junction leakage due to local electrical punch-through of the source and drain junctions arising from a rough NiSi/n-Si interface. Further, the methodology provided by the present invention enjoys diverse utility in the manufacture of numerous and various types of semiconductor devices and/or components employing salicide technology.

DISCLOSURE OF THE INVENTION

An advantage of the present invention is an improved method for forming an electrically conductive nickel silicide (NiSi) layer on a Si-based semiconductor substrate.

Another advantage of the present invention is an improved method for forming an electrically conductive NiSi layer on an n-type doped region of a Si semiconductor substrate.

Yet another advantage of the present invention is an improved method of manufacturing a Si-based NMOS transistor or CMOS device including electrically conductive NiSi layers formed in contact with n-type doped source and drain regions.

Still another advantage of the present invention is improved Si-based semiconductor devices comprising at least one electrically conductive NiSi layer formed in contact with an n-type doped Si region.

Additional advantages and other features of the present invention will be set forth in the description which follows and in part will become apparent to those having ordinary skill in the art upon examination of the following or may be learned from the practice of the present invention. The advantages of the present invention may be realized as particularly pointed out in the appended claims.

According to an aspect of the present invention, the foregoing and other advantages are obtained in part by a method of manufacturing a semiconductor device, which method comprises the steps of:

(a) providing a silicon (Si)-based semiconductor substrate having a surface;

(b) introducing a non-arsenic (As)-containing n-type dopant into at least one selected portion of the substrate to form a junction within the substrate at a first depth below the substrate surface, such that the concentration vs. depth profile of the non-As-containing n-type dopant has a first peak at a second depth below the substrate surface;

(c) forming a layer of nickel (Ni) on the substrate surface overlying the at least one selected portion of the substrate;

(d) reacting the Ni layer with the at least one selected portion of the Si-based substrate to form a layer of an electrically conductive nickel silicide (NiSi) extending below the substrate surface to a third depth which is substantially equal to the second depth and less than the first depth, whereby the interface between the NiSi layer and the at least one selected portion of the Si-based substrate at the third depth is substantially smooth and penetration of the junction at the first depth due to the NiSi layer is substantially eliminated.

According to embodiments of the present invention, step (b) comprises implanting ions of the non-As-containing n-type dopant.

According to particular embodiments of the present invention, step (b) comprises implanting ions of at least one member selected from the group consisting of phosphorus (P) and antimony (Sb).

According to further embodiments of the present invention, the method further comprises the step (e) of introducing As n-type ions into the at least one selected portion of the substrate adjacent the surface thereof, such that the concentration vs. depth profile of the As ions exhibits a second peak at a fourth depth below the substrate surface which is less than the second depth and the second peak dopant concentration is less than the first peak dopant concentration; wherein the method comprises either performing step (b) followed by step (e) or performing step (e) followed by step (b).

According to still further embodiments of the present invention, step (a) comprises providing a monocrystalline Si wafer substrate; step (b) comprises implanting non-As-containing n-type dopant ions for forming n-type source and drain regions in at least a pair of selected portions of the substrate as part of a process for forming an NMOS transistor or CMOS device, e.g., by implanting non-As-containing n-type dopant ions comprising at least one of P and Sb at a dosage and energy such that the first and second depths, respectively, are from about 450 to about 780 Å and from about 180 to about 360 Å below the substrate surface for P ions and from about 375 to about 840 Å and from about 180 to about 360 Å below the substrate surface for Sb ions; step (c) comprises forming a Ni layer from about 100 to about 200 Å thick; step (d) comprises reacting the Ni layer with the Si substrate to form the layer of electrically conductive NiSi extending to the third depth below the substrate surface of from about 180 to about 360 Å; and step (e) comprises implanting As n-type dopant ions such that the fourth depth is from about 100 to about 200 Å below the substrate surface.

According to particular embodiments of the present invention, step (b) comprises implanting non-As-containing n-type dopant ions at a dosage of from about $2\times10^{15}$ to about $6\times10^{15}$ da/cm$^2$ and energy of from about 10 to about 30 KeV for P ions and energy of from about 30 to about 75 KeV for Sb ions; step (d) comprises heating the Ni layer in an inert atmosphere at from about 300 to about 550° C. for from about 30 to about 60 sec.; and step (e) comprises implanting the As n-type dopant ions at a dosage of from about $1\times10^{15}$ to about $2\times10^{15}$ da/cm$^2$ and energy of from about 2 to about 5 KeV.

According to another aspect of the present invention, a method of manufacturing an NMOS transistor or CMOS semiconductor device comprises the steps of:

(a) providing a Si semiconductor substrate having a surface;

(b) forming a thin gate insulator layer in contact with the substrate surface;

(c) forming an electrically conductive gate electrode on a portion of the thin gate insulator layer, the gate electrode comprising first and second opposing side surfaces and a top surface;

(d) forming a pair of As-doped, shallow-depth, n-type source and drain extension regions in spaced-apart portions of the substrate, each of the source and drain extension regions extending laterally to beneath an edge of a respective one of the first and second opposing side surfaces of the gate electrode;

(e) forming sidewall spacers composed of an insulating material on each of the first and second opposing side surfaces of the gate electrode;

(f) forming, by implantation of non-As-containing n-type dopant ions utilizing the sidewall spacers as an implantation mask, a pair of deeper n-type source and drain regions within the source and drain regions formed in step (d), such that a junction is formed between each of the deeper source and drain regions and the substrate at a first depth below the substrate surface;

(g) forming a layer of Ni on the substrate surface overlying at least the pair of source and drain regions; and (h) reacting the Ni layer to form an electrically conductive NiSi layer extending into the pair of source and drain regions for a second depth below the substrate surface, the second depth being less than the first depth, whereby the interfaces between the NiSi layers and the deeper source and drain regions at the second depth are substantially smooth and penetration of the junctions at the first depth due to roughness of the NiSi layer is substantially eliminated.

According to embodiments of the present invention, the method comprises either performing step (d) followed by step (f), or performing step (f) followed by step (d).

According to particular embodiments of the present invention, step (d) comprises forming the pair of As-doped n-type source and drain extension regions at a shallow depth of from about 100 to about 200 Å; step (f) comprises implanting the non-As-containing dopant ions at a dosage and energy such that the first depth is from about 450 to about 780 Å below the substrate surface for P ions and from about 375 to about 840 Å below the substrate surface for Sb ions; step (g) comprises forming a Ni layer having a thickness of from about 100 to about 200 Å; and step (h) comprises reacting the Ni layer with the Si substrate to form a NiSi layer extending to the second depth below the substrate surface of from about 180 to about 360 Å, wherein: step (d) comprises implanting As ions at a dosage of from about $1\times10^{15}$ to about $2\times10^{15}$ da/cm$^2$ and energy of from about 2 to about 5 KeV; step (f) comprises implanting the non-As-containing ions at a dosage of from about $2\times10^{15}$ to about $6\times10^{15}$ da/cm$^2$ and energy of from about 10 to about 30 KeV for P ions and energy of from about 30 to about 75 KeV for Sb ions; and step (h) comprises heating the Ni layer in an inert atmosphere at from about 300 to about 550° C. for from about 30 to about 60 sec.

According to yet another aspect of the present invention, a semiconductor device comprises:

(a) a Si semiconductor substrate having a surface;

(b) at least one n-type doped region formed in the substrate, the n-type doped region comprising:

(i) implanted As n-type dopant ions adjacent the substrate surface, the concentration vs. depth profile of the implanted As-containing dopant ions exhibiting a first peak dopant concentration at a first depth below the substrate surface; and (ii) implanted non-As-containing n-type dopant ions below the implanted As ions and comprising ions of at least one of P and Sb, the implanted non-As-containing n-type dopant ions forming a junction with the Si substrate at a second depth below the substrate surface, the concentration vs. depth profile of the implanted non-As-containing n-type dopant ions exhibiting a second peak dopant concentration at a third depth below the substrate surface, the third depth being greater than the first depth and the second peak dopant concentration being greater than the first peak dopant concentration; and (c) an electrically conductive NiSi layer extending from the substrate surface into the at least one n-type doped region to a fourth depth below the substrate surface, the fourth depth being greater than the first depth but less than the second depth and substantially equal to the third depth; whereby the interface between the NiSi layer and the at least one n-type doped region of the substrate at the fourth depth is substantially smooth and penetration of the junction at the second depth due to roughness of the NiSi layer is substantially eliminated.

According to embodiments of the present invention, the at least one n-type As-doped region is a source or drain region of an NMOS transistor or a CMOS device.

Additional advantages and aspects of the present invention will become readily apparent to those skilled in the art from the following detailed description, wherein only the preferred embodiment of the present invention is shown and described, simply by way of illustration of the best mode contemplated for carrying out the present invention. As will be described, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWING

The following detailed description of the embodiments of the present invention can best be understood when read in conjunction with the following drawings, in which the various features are not necessarily drawn to scale but rather are drawn as to best illustrate the pertinent features, and in which like reference numerals are employed throughout to designate similar features, wherein.

DESCRIPTION OF THE INVENTION

The present invention addresses and solves problems arising from manufacturing submicron-dimensioned, shallow-junction NMOS transistors and CMOS devices suitable for use in high-density integration semiconductor devices, wherein, as part of the fabrication methodology, electrically conductive metal silicide layers are formed in contact with doped semiconductor regions, e.g., source and drain regions. More specifically, the present invention advantageously provides an improvement in salicide technology by affording a significant and substantial reduction in the amount and severity of roughness of the NiSi/n-Si interface exhibited when electrically conductive NiSi layers are formed on and in contact with As-doped n-type Si substrates. The inventive methodology thus provides a significantly reduced amount or degree of local electrical punch-through or "spiking" of the source and drain junctions by the NiSi layers, typically manifested as increased junction leakage current. Moreover, the present invention provides improved transistor performance and device reliability, while decreasing product yield problems associated with the conventional salicide technology. In addition, the inventive methodology is fully compatible with all other aspects of existing processing methodology and process flow for automated manufacture of submicron-dimensioned transistors and CMOS and IC semiconductor devices.

The present invention is based upon the discovery that formation of high quality interfaces between electrically conductive nickel suicides (e.g., NiSi) and As-containing n-type Si or Si-based semiconductor layers or substrates, e.g., NiSi/As-doped n-type Si wafer interfaces, for use in NMOS transistors and CMOS devices, can be readily formed by a process which generally follows conventional salicide processing, e.g., as illustrated in FIGS. 1(A)–1(I) but is modified in key respect to eliminate, or at least substantially reduce, disadvantageous roughness of the NiSi/n-Si interface leading to localized electrical punch-through ("spiking") of source/drain junctions, manifesting in increased junction leakage current, by reducing the concentration of As-containing n-type dopant in the Si layer or substrate in the region or stratum thereof where the silicidation reaction occurs to a level not exceeding a predetermined maximum level, below which roughness of the NiSi/n-Si interface does not result. A key feature of the present invention is the introduction (e.g., by ion implantation) of a non-As-containing dopant species into the Si substrate during a "main" implantation step for forming an n-type doped region in the substrate as part of a conventional process flow or sequence (e.g., as described supra with reference to FIG. 1(F)), such that a junction (e.g., a source/drain junction) is formed between the resultant non-As-containing n-type doped region and the Si layer or substrate at a first depth, and the electrically conductive NiSi layer is formed to a second depth above first depth. If desired, the uppermost portion or strata of the Si layer or substrate may receive a light doping of an As-containing n-type dopant species, as in the formation of lightly-doped, shallow-depth source/drain extension regions described supra and illustrated in FIG. 1(E). As a consequence of the inventive methodology, wherein the As-containing dopant conventionally employed for performing the "main implant" step (FIG. 1(F)) is replaced with a non-As-containing n-type dopant, the presence of As ions/atoms in the vicinity of the NiSi/n-Si interface during silicidation reaction is entirely eliminated, or at least reduced, to a level below that necessary for NiSi/n-Si interface roughness to occur. As a consequence of the inventive methodology, local electrical punch-through or "spiking", e.g., of source/drain junctions in NMOS transistors and CMOS devices, is eliminated or at least substantially reduced, and reduced leakage current junctions are obtained. As a further consequence of the inventive methodology, high quality, Si-based, submicron-dimensioned, shallow-junction NMOS transistors and CMOS devices can be reliably and conveniently fabricated in a cost-effective manner utilizing conventional manufacturing techniques and apparatus.

Figure 3A:
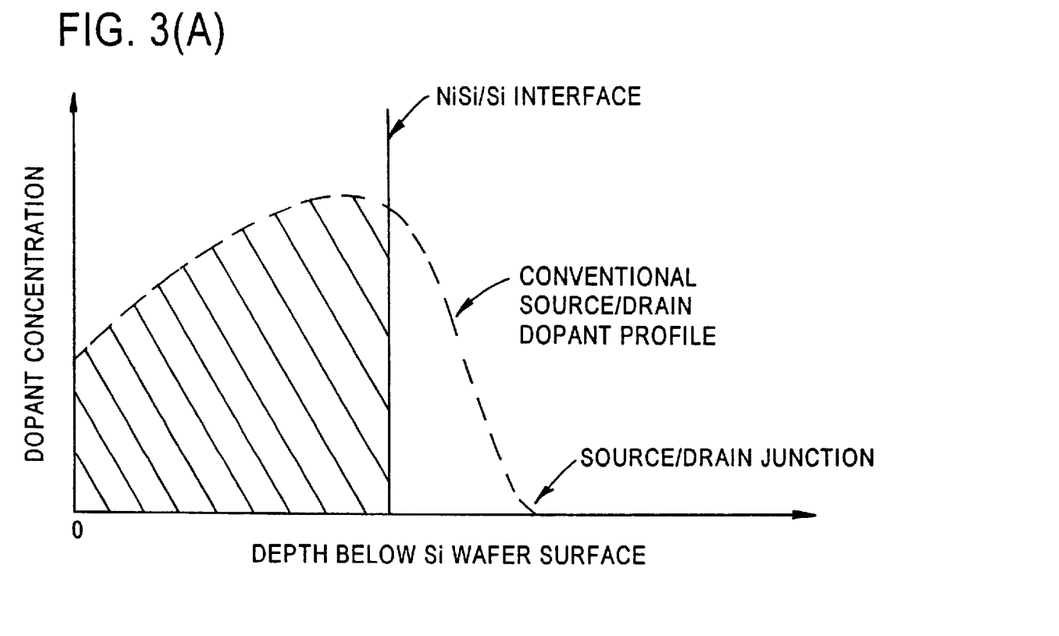
FIGS. 3(A)–3(B) are graphs illustrating dopant concentration vs. depth profiles for the n-type source/drain implantations performed according to the conventional and inventive salicide methodologies, respectively.

Referring now to FIG. 3(A), shown therein, by way of illustration only, is a conventional dopant concentration vs. depth profile for As n-type dopant ions introduced into a monocrystalline Si wafer substrate as a result of performing a "main" implantation step for forming source and drain junctions as part of a process sequence for forming MOS transistors and CMOS devices, i.e., corresponding to the situation which is obtained upon completion of the process stage described above with reference to FIG. 1(F). According to the illustrated example of the conventional methodology for implantation of As n-type dopant ions into monocrystalline Si wafer substrates for conducting the "main" implantation step of FIG. 1(F), implantation of As ions is performed at a dosage of from about $4 \times 10^{15}$ to about $6 \times 10^{15}$ da/cm$^2$ and ion energies of from about 30 to about 40 KeV, whereby the obtained As concentration vs. depth profile extends below the Si substrate surface to form a junction (e.g., a source/drain junction) at a first depth and exhibits a peak As concentration of about $5 \times 10^{20}$ da/cm$^3$ at a second depth of from about 200 to about 300 Å below the Si surface. Silicidation reaction to form NiSi layers conventionally occurs to a third depth below the Si surface of from about 180 to about 360 Å, utilizing Ni precursor layers of thickness of from about 100 to about 200 Å and a RTA in an inert atmosphere at a temperature of from about 300 to about 500° C. for from about 30 to about 60 sec.

The total amount, thus concentration, of As n-type dopant ions initially contained in the region or stratum of the Si substrate subsequently subjected to silicidation reaction to form NiSi is indicated in FIG. 3(A) by the single-hatched lines. As is apparent from the figure, a significant total amount or concentration of As ions is at least initially present in the silicidation region or stratum (extending from the Si surface down to the indicated NiSi depth), and thus available for inclusion in the NiSi layer. Because of the tendency for As ions/atoms to be rejected (i.e., expelled) from NiSi and thus reduce their concentration in the NiSi, and because the concentration of As ions/atoms in the NiSi exceeds a threshold level, significant roughness occurs at the NiSi/n-Si interface as, for example, shown in FIG. 2, leading to local electrical punch-through ("spiking") of the lower-positioned source and drain junctions by the NiSi layers, manifesting in increased junction current leakage and diminished transistor characteristics.

While the exact mechanism for the increased roughness of the NiSi/n-Si interfaces which occurs with As-doped n-type Si is not known with certainty, and not wishing to be bound by any particular theory, it is nonetheless believed that the above-mentioned tendency for As ions/atoms to be rejected (i.e., expelled) from NiSi films into the underlying n-Si is responsible for the observed interfacial roughness in view of the requirement for the relatively large As ions/atoms to transit, and thus damage, the NiSi/n-Si interface upon rejection (i.e., expulsion) from the NiSi layer.

Figure 3B:
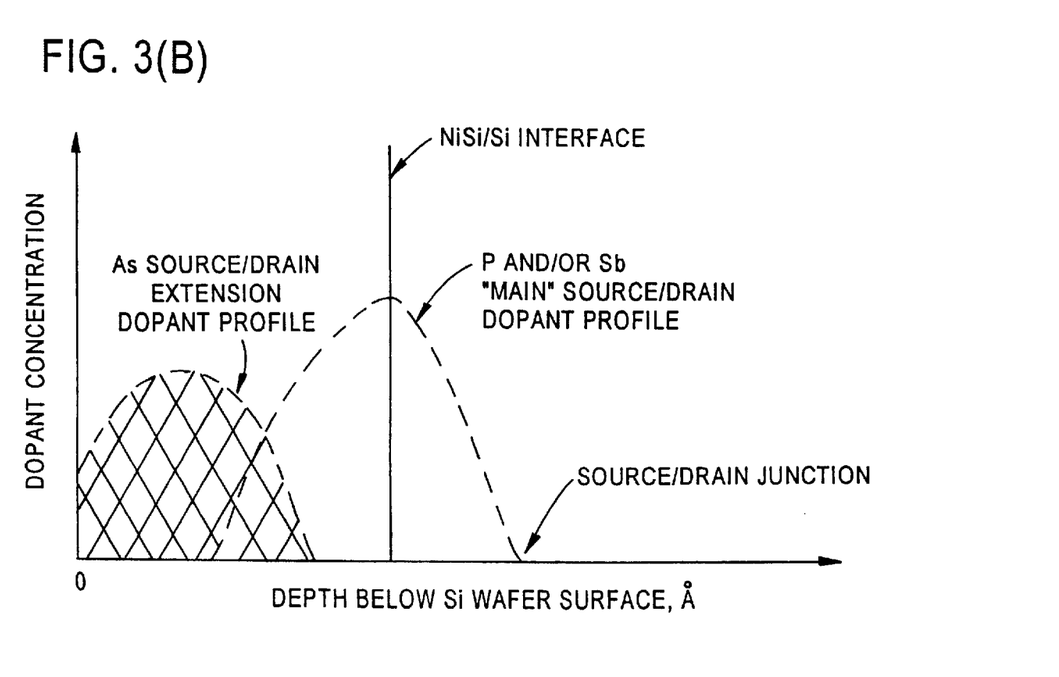

Referring now to FIG. 3(B), according to the invention, the "main" implantation step of FIG. 1(F) is modified from that conventionally employed, so as to implant the Si wafer substrate with non-As-containing n-type dopant ions, e.g., P and/or Sb-containing ions, such that the concentration vs. depth profile of the implanted non-As-containing dopant ions (1) extends for a distance below the Si substrate to form a junction (e.g., a source/drain junction) at a (first) depth within the substrate; and (2) exhibits a (first) peak, or maximum dopant concentration at a (second) depth below the Si surface. By way of illustration only, suitable conditions for implantation of non-As-containing n-type dopant ions, e.g., P and/or Sb-containing ions, into monocrystalline Si wafer substrates such that a non-As-containing concentration vs. depth profile as illustrated in FIG. 3(B) is obtained, wherein the non-As-containing dopant concentration is at a (first) maximum or peak concentration of about $5 \times 10^{20}$ da/cm$^3$ at a (first) depth of from about 180 to about 360 Å below the Si surface, are: dosages of P and/or Sb-containing ions of from about $2 \times 10^{15}$ to about $6 \times 10^{15}$ da/cm$^2$ at energies of from about 10 to about 30 KeV for P ions and from about 30 to about 75 KeV for Sb ions.

Another advantageous feature of the present invention, particularly useful in the context of NMOS and CMOS manufacture, is the ability to retain conventional methodology for forming shallow-depth, As-doped, n-type source and drain extension regions (e.g., 130, 132) at the uppermost stratum of the Si substrate (102), as for example, described above and illustrated in FIG. 1(E). By way of illustration only, crystalline Si substrates may be implanted with As-containing n-type dopant ions at dosages of from about $1 \times 10^{15}$ to about $2 \times 10^{15}$ da/cm$^2$ and energies of from about 2 to about 5 KeV to form source/drain extension regions having an As dopant concentration vs. depth profile having a lightly-doped (second) peak dopant concentration of from about $1 \times 10^{20}$ to about $1 \times 10^{21}$ da/cm$^3$ at a (fourth) shallow depth of from about 100 to about 200 Å below the substrate surface.

According to the invention, a Ni layer of conventional thickness is formed over at least the ion-implanted source/drain regions in conventional manner and reacted with the substrate under conventional silicidation conditions. By way of example only, a blanket layer of Ni having a thickness of from about 100 to about 200 Å may be deposited over the substrate surface by a suitable PVD process, such as DC sputtering, and subjected to RTA in an inert atmosphere (e.g., N$_2$) at an elevated temperature of from about 300 to about 550° C. for from about 30 to about 60 sec. to form an electrically conductive NiSi layer extending to a (third) depth below the Si substrate of from about 180 to about 360 Å, which depth is substantially equal to the (second) depth of the maximum concentration of the non-As-containing n-type dopant and less than the (first) depth of the junction within the substrate.

The total amount, thus concentration, of As n-type dopant initially contained in the shallow-depth, source/drain extension regions (e.g., 130, 132) of the Si substrate subsequently subjected to silicidation reaction with the overlying Ni layer to form NiSi, is indicated in FIG. 3(B) by the double-hatched lines. As is apparent from the figure, the total amount or concentration of As n-type dopant ions in the silicidation region or stratum (extending from the Si surface down to the indicated NiSi depth), and thus available for inclusion in the NiSi layer, is significantly lower than according to conventional practice, as shown in FIG. 3(A). As a consequence, according to the present invention, the concentration of As-containing dopant present in the silicidation region or stratum is below the threshold value necessary for rough-textured NiSi/Si interfaces to occur in that the number of rejected (i.e., expelled) As atoms/ions transiting the NiSi/Si interface is too low to result in interface damage leading to roughness thereof. Therefore, as a further consequence of the present invention, local electrical punch-through or "spiking" of n-type source and drain/substrate junctions by NiSi layers, formed as part of salicide processing, is eliminated, or at least substantially reduced, resulting in high-quality, shallow source/drain junctions with decreased leakage currents.

Thus, as a consequence of the inventive methodology, disadvantageous formation of rough NiSi/n-Si interfaces is eliminated, or at least substantially minimized, so as to yield high-quality, low leakage current, shallow-depth source and drain junctions suitable for use in the fabrication of submicron-dimensioned NMOS transistors and various CMOS and IC devices with improved operating characteristics. Moreover, the inventive methodology is not limited to use with the illustrated embodiment wherein a NiSi layer is formed on an n-type Si source/drain region as part of a sequence of process steps utilized in the formation of NMOS transistors and CMOS devices, but rather is applicable to the manufacture of all manner of semiconductor devices requiring the formation of electrically conductive NiSi layers on n-doped Si substrates. Further, the invention can be practiced by use of conventional methodologies and instrumentalities at rates consistent with the throughput requirements of automated manufacturing processes and is fully compatible with conventional process flow for the manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of manufacturing a semiconductor device, which method comprises the steps of:
   (a) providing a silicon (Si)-based semiconductor substrate having a surface;
   (b) introducing a non-arsenic (As)-containing n-type dopant into at least one selected portion of said substrate to form a junction within said substrate at a first depth below said substrate surface, such that the concentration vs. depth profile of said non-As-containing dopant has a first peak at a second depth below said substrate surface;
   (c) forming a layer of nickel (Ni) on said substrate surface overlying said at least one selected portion of said substrate; and
   (d) reacting said Ni layer with said at least one selected portion of said Si-based substrate to form a layer of an electrically conductive nickel silicide (NiSi) extending below said substrate surface to a third depth which is substantially equal to said second depth and less than said first depth, whereby the interface between said NiSi layer and said at least one selected portion of said Si-based substrate at said third depth is substantially smooth and penetration of said junction at said first depth due to roughness of said NiSi layer is substantially eliminated.

2. The method as in claim 1, wherein:
   step (b) comprises implanting ions of said non-As-containing n-type dopant.

3. The method as in claim 2, wherein:
   step (b) comprises implanting ions of at least one member selected from the group consisting of phosphorus (P) and antimony (Sb).

4. The method as in claim 1, further comprising the step of:
   (e) introducing As n-type dopant ions into said at least one selected portion of said substrate adjacent said surface thereof, such that the concentration vs. depth profile of said As ions exhibits a second peak at a fourth depth below said substrate surface which is less than said second depth and said second peak concentration is less than said first peak concentration.

5. The method as in claim 4, wherein:
   step (e) comprises implanting As ions.

6. The method as in claim 4, comprising:
   performing step (b) followed by step (e).

7. The method as in claim 4, comprising:
   performing step (e) followed by step (b).

8. The method as in claim 1, wherein:
   step (b) comprises implanting non-As-containing n-type dopant ions for forming n-type source and drain regions in at least a pair of selected portions of said Si-based substrate as part of a process for forming an NMOS transistor or CMOS device.

9. The method as in claim 8, wherein:
   step (a) comprises providing a monocrystalline Si wafer substrate;
   step (b) comprises implanting said non-As-containing n-type dopant ions comprising at least one of P and Sb at a dosage and energy such that said first and second depths, respectively, are from about 450 to about 780 Å and from about 180 to about 360 Å below said substrate surface for P ions and from about 375 to about 840 Å and from about 180 to about 360 Å below said substrate surface for Sb ions;
   step (c) comprises forming a Ni layer having a thickness of from about 100 to about 200 Å;
   step (d) comprises reacting said Ni layer with said Si substrate to form said electrically conductive NiSi layer extending to said third depth below said substrate surface of from about 180 to about 360 Å.

10. The method as in claim 9, further comprising the step of:
    (e) implanting said source and drain regions with As n-type dopant ions at a dosage and energy such that the concentration vs. depth profile of said As ions has a second peak dopant concentration at a fourth depth below said substrate surface which is less than said second depth and said second peak dopant concentration is less than said first peak dopant concentration, said fourth depth being from about 100 to about 200 Å below said substrate surface.

11. The method as in claim 10, comprising:
    performing step (b) prior to performing step (e).

12. The method as in claim 10, comprising:
    performing step (e) prior to performing step (b).

13. The method as in claim 10, wherein:
    step (b) comprises implanting said non-As-containing n-type dopant ions at a dosage of from about $2\times10^{15}$ to about $6\times10^{15}$ da/cm$^2$ and energy of from about 10 to about 30 KeV for P ions and energy of from about 30 to about 75 KeV for Sb ions;
    step (d) comprises heating said Ni layer in an inert atmosphere at from about 300 to about 550° C. for from about 30 to about 60 sec; and
    step (e) comprises implanting said As n-type dopant ions at a dosage of from about $1\times10^{15}$ to about $2\times10^{15}$ da/cm$^2$ and energy of from about 2 to about 5 KeV.

14. A method of manufacturing an NMOS transistor or CMOS semiconductor device, which method comprises the steps of:
    (a) providing a Si semiconductor substrate having a surface;
    (b) forming a thin gate insulator layer in contact with said substrate surface;
    (c) forming an electrically conductive gate electrode on a portion of said thin gate insulator layer, said gate electrode comprising first and second opposing side surfaces and a top surface;
    (d) forming a pair of relatively lightly As-doped, shallow-depth, n-type source and drain extension regions in spaced-apart portions of said substrate, each of said source and drain extension regions extending laterally to beneath an edge of a respective one of said first and second opposing side surfaces of said gate electrode;
    (e) forming sidewall spacers composed of an insulating material on each of said first and second opposing side surfaces of said gate electrode;
    (f) forming, by implantation of non-As-containing n-type dopant ions utilizing said sidewall spacers as an implantation mask, a pair of relatively heavier-doped and deeper n-type source and drain regions in said source and drain regions formed in step (d), such that a junction is formed between each of said deeper, heavier-doped source and drain regions and said substrate at a first depth below said substrate surface;

(g) forming a layer of Ni on said substrate surface overlying at least said pair of source and drain regions; and (h) reacting said Ni layer to form an electrically conductive NiSi layer extending into said pair of source and drain regions for a second depth below said substrate surface, said second depth being less than said first depth, whereby the interfaces between the NiSi layers and the deeper, heavier-doped source and drain regions at said second depth are substantially smooth and penetration of said junctions at said first depth due to roughness of said NiSi layer is substantially eliminated, wherein step (d) comprises forming said pair of relatively lightly As-doped n-type source and drain extension regions at a shallow depth of from about 100 to about 200 Å;

step (f) comprises implanting said non-As-containing n-type dopant ions at a dosage and energy such that said first depth is from about 450 to about 780 Å below said substrate surface for P ions and from about 375 to about 840 Å below the substrate surface for Sb ions;

step (g) comprises forming a Ni layer having a thickness of from about 100 to about 200 Å; and step (h) comprises reacting said Ni layer with said Si substrate to form a NiSi layer extending to said second depth below said substrate surface of from about 180 to about 360 Å.

15. The method as in claim 14, wherein:

step (d) comprises implanting As ions at a dosage of from about $1\times10^{15}$ to about $2\times10^{15}$ da/cm$^2$ and energy of from about 2 to about 5 KeV;

step (f) comprises implanting said non-As-containing n-type dopant ions comprising at least one of P and Sb at a dosage of from about $2\times10^{15}$ to about $6\times10^{15}$ da/cm$^2$ and energy of from about 10 to about 30 KeV for P ions and energy of from about 30 to about 75 KeV for Sb ions; and step (h) comprises heating said Ni layer in an inert atmosphere at from about 300 to about 550° C. for from about 30 to about 60 sec.

* * * * *